United States Patent [19]
Consi

[11] Patent Number: 5,838,722
[45] Date of Patent: Nov. 17, 1998

[54] MONOLITHIC TRANSCEIVER INCLUDING FEEDBACK CONTROL

[75] Inventor: Michael Consi, Lindenhurst, N.Y.

[73] Assignee: Aeroflex, Inc., Plainview, N.Y.

[21] Appl. No.: 638,907

[22] Filed: Apr. 24, 1996

[51] Int. Cl.[6] ............... H04B 1/38; H04B 3/00; H03K 19/0175; H03F 1/23

[52] U.S. Cl. .......... 375/219; 375/258; 326/82; 327/108; 330/260; 330/291

[58] Field of Search ............ 375/219, 257, 375/258, 295; 395/200.8, 200.83; 326/82, 83, 86, 89, 90; 327/108, 110, 590; 330/75, 85, 102, 260, 291

[56] References Cited

U.S. PATENT DOCUMENTS 5,627,486  5/1997  Gross ........................ 327/108

Primary Examiner—Stephen Chin
Assistant Examiner—Jeffrey W. Gluck
Attorney, Agent, or Firm—Schweitzer Cornman Gross & Bondell LLP

[57] ABSTRACT

A new improved all monolithic transceiver may be manufactured on a single semiconductor die for operation from a single +5 v power supply. The transceiver includes a transmitter of novel design which provides zero output current for a zero signal input. The transmitter may include a linear feedback operational amplifier driver, wherein the driver bias current is enabled only in the presence of a driver input signal. The transceiver is designed to meet the requirements of both MIL-STD 1553 as well as the McDonnell Douglas (MACAIR) A3818, A4905, A5232 and A5690.

6 Claims, 12 Drawing Sheets

MONOLITHIC TRANSCEIVER INCLUDING FEEDBACK CONTROL

This invention relates generally to a solid state transceiver designed to process digital and analog information between two or more computers, typically in avionic environments, as well as in other military and commercial applications, such as missiles, satellites and test equipment. More specifically the present invention relates to a transceiver design which may be effectively implemented on a single silicon die, utilizing and relying on all of the attributes of such technology, and which further incorporates a transmitter of new and improved design.

BACKGROUND OF THE INVENTION

In modern communication systems where computers are used to talk to other computers and control peripheral devices, such as in military avionics buses, missiles, tanks, satellites and test equipment, it has been common practice to use an interface device to send and receive the digital and analog information passing between the computers and peripheral devices coupled thereto. The interconnection has traditionally been a hard wired differential bus, comprising a twisted pair of wires terminating in its characteristic impedance. An interface device, the transceiver, is used to send data along and receive data from the bus. The transceiver is usually connected to the bus via a coupling transformer, and indeed the transformer plays an integral part in the overall operation of the interface. The transceiver/transformer combination must be designed to provide signals of sufficient amplitude and spectral content to insure proper communication between computers and peripheral devices coupled to the bus.

In the past it has been common practice to implement the transceiver function through thick film chip and wire hybrid technology. This practice required that a common insulating ceramic substrate be used to support the electrical interconnections between the various chip transistors, resistors, capacitors and integrated circuits required to perform the necessary circuit functions. Such a construction represented a step up in system integration from the use of discrete components on a printed circuit board and resulted in weight and space reduction, while improving the reliability of the system. Such a hybrid transceiver, which was not inexpensive, has been used successfully for more than 20 years. In the recent past monolithic transceivers, comprising single integrated circuits, have begun to replace the hybrid circuits so that space, weight and cost could be further reduced. Both hybrid and monolithic designs in recent years have come to utilize a single supply as their source of power. A +5 v supply has become the de facto standard, since most digital systems use solely this voltage.

With respect to the transmitting section of the transceiver, there have been two traditional design formats applied. The first format was to use two linear feedback amplifiers to drive the coupling transformer in a push-pull manner. This required the use of a bipolar supply voltage, usually ±15 volts, to derive the required signal levels, as well as an additional +5 v supply for the digital section of the transceiver. This technique had the advantage of low output impedance and linear waveshaping/filtering and was relatively easy to implement. The low output impedance allowed it to be relatively insensitive to load variations. It did suffer, however, from high standby power dissipation due to the quiescent current required to bias the amplifiers in their linear range, and from the component count required to implement these amplifiers. In addition, a means for switching the transmitter output impedance from low to high, to allow for multiplexing of the data bus signals, is required.

These drawbacks led to the development of the second design format, which involved use of switching techniques. Instead of two linear amplifiers being used to drive the output transformers in a push-pull manner, two transistors were used to alternately drive a current into one-half of the primary winding of the coupling transformer. When one side is driving the other side must be in a high impedance state to prevent driving of that half. Thus, the transformer primary winding had to have a grounded center-tap, since the drive transistors needed a return current path. Supply-connected center-taps were also used. In either case power was derived from a positive supply voltage, usually +15 or +12 volts, chosen to provide the required primary voltage swing with the transformer turns ratios available.

The second method usually also used an output transistor configured as a current source, so that it could both drive the required current when enabled and revert to a high output impedance state when not enabled. This technique also allowed the use of a single supply system, since all the power could be drawn from a positive supply voltage. This subsequently allowed implementation using a single +5 v supply, already needed for the digital section of the transceiver. A corresponding change in transformer turns ratios was required, however, to accommodate the smaller output voltage swing on the primary winding of the coupling transformer resulting from use of a 5 volt, rather than a 12 volt, supply.

The second implementation format for the transmitting function of the transceiver found more widespread use in MIL-STD 1553 systems than the first format, since linear filtering and low output impedance, available in the first design format, were not requirements. Advantages of the second format were lower cost, lower component count, single supply operation, and lack of a need for special means to switch into a high impedance mode. In addition, with method two, standby power dissipation was considerably reduced, since little or no quiescent current was required when a driving signal was not present. This was especially true in the single +5 v versions. One of the disadvantages of the second format, however, was that it could not provide a low impedance when driving the coupling transformer, and therefore was subject to load impedance as well as transformer turns ratio considerations. That is, if the output transistor current source was designed to provide the current to drive a transformer of turns ratio $N_1$, it might not be able to properly drive a transformer with turns ratio $N_2$, since the transistor's output current was constant. Depending on the new turns ratio, the output voltage on the primary winding of the coupling transformer might well be too low, or so high that it could drive the other output transistor into saturation. Transceiver manufacturers designed their respective circuits for the specific transformer turns ratio they utilized to optimize the operation of their particular transceiver. Thus, in field use one could find two or three different transformer turns ratios, causing replacement problems.

Other deficiencies were also noted with the second design format. If the data bus happened to be open circuited, the output transistors would go into saturation. When saturation of the output current sources (transistors) occur, proper switching speeds and timing cannot be maintained, and errors can be generated. In addition, since the second format switches alternate currents into the transformer, any difference between the two currents would be accumulated as a stored charge and returned to the load when all switching ceased. This return energy would cause an offset voltage to appear across the load, which in turn could cause the receiver to respond falsely. Further, implementations of the second format, whether as a hybrid circuit or as a single monolithic integrated circuit, include current source designs derived in a open loop fashion which suffer in varying degree to voltage offset due to current imbalance. This is of particular concern when the circuit must operate over a wide temperature range, such as in military system use. A final disadvantage of the second format is that it is totally precluded from use in MACAIR specification systems since the MACAIR specification requires transmit signal filtering and low output impedance output drive.

BRIEF SUMMARY OF THE INVENTION

A general purpose and principle objective of the present invention is to combine the advantages of each of the traditional two formats of transceiver transmitter implementation for an improved +5 v single supply transceiver.

Another purpose of the invention is to permit utilization of the same grounded center-tap transformer already in use in many field applications.

Another purpose of the present invention is to provide a transceiver having drive output voltage balance in its transmitter section irrespective of load conditions.

Still another purpose of the present invention is to provide a transceiver transmitter section with a switching level at or just above zero input, without presence of a dead zone.

Yet another purpose of the present invention is to provide a transceiver able to maintain transmitter output impedance in a high state when the input signal is zero and while maintaining output impedance at a low state when the input signal is other than zero.

Another purpose of the present invention is to provide a transceiver having a transmitter section that can accommodate a range of coupling transformer turn ratios without the need for external or internal adjustment.

The foregoing and other purposes and objects are met in the present invention which provides an improved +5 volt single supply transceiver utilizing the matching thermal and electrical characteristics of monolithic ASIC design processes. Feedback mechanisms are employed to set and balance the output voltage. In addition, ground-sensing means are employed to allow the predriver/drivers for the output transformer to have a switching point approaching zero input without any appreciable offset or dead zone. The matching thermal and electrical characteristics of monolithic ASIC design processes are utilized to achieve stability and balance, whereby the requirements of both MIL-STD 1553 and MACAIR specifications may be met on a single die transceiver.

BRIEF DESCRIPTION OF THE DRAWINGS

A fuller understanding of the present invention will be achieved upon consideration of the following detailed description of a preferred illustrative embodiment of a transceiver designed in accordance with the invention, when considered in association with the annexed drawings, wherein.

DETAILED DESCRIPTION OF THE TRANSMITTER

Figure 1:
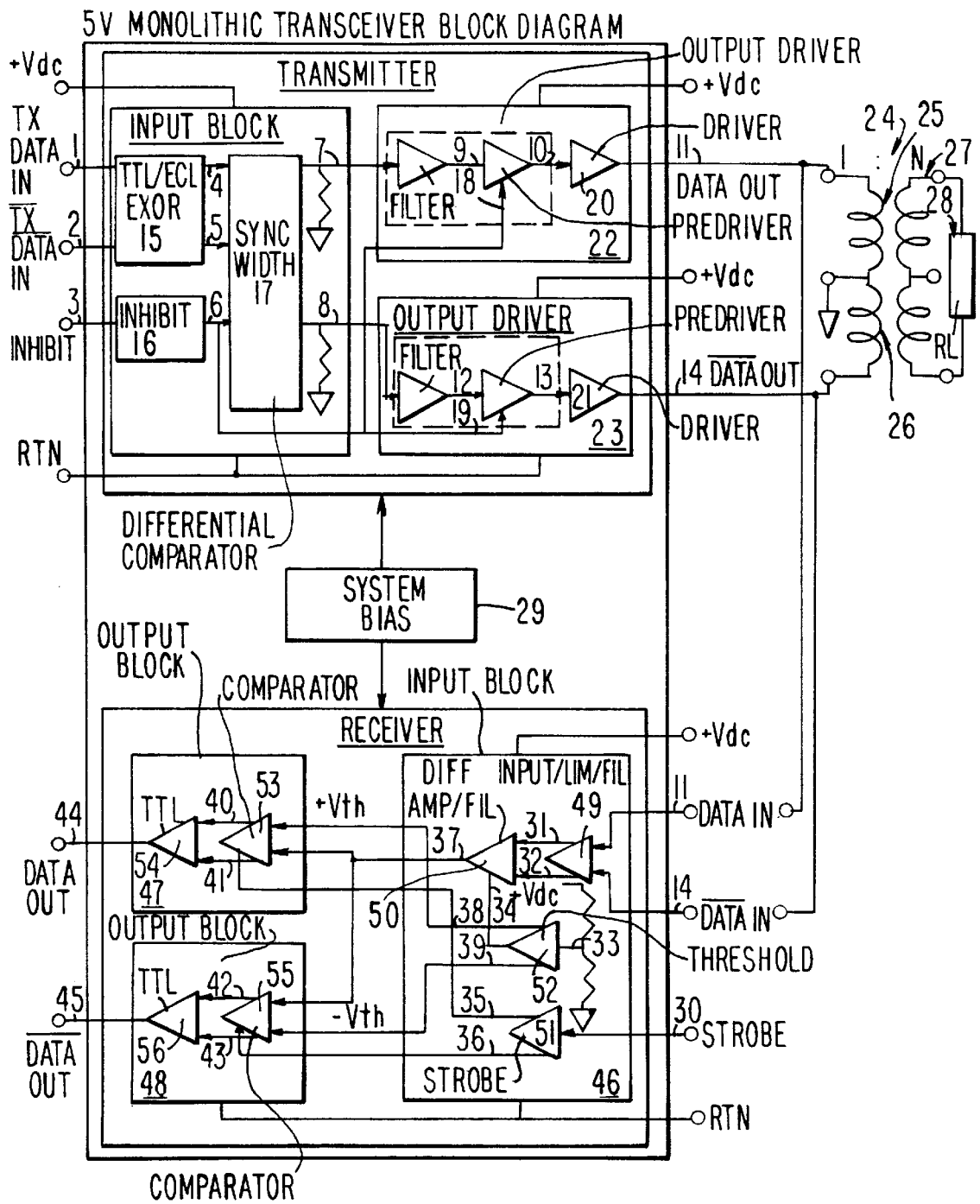
FIG. 1 is a block diagram of a transceiver constructed in accordance with the present invention.
Figure 2:
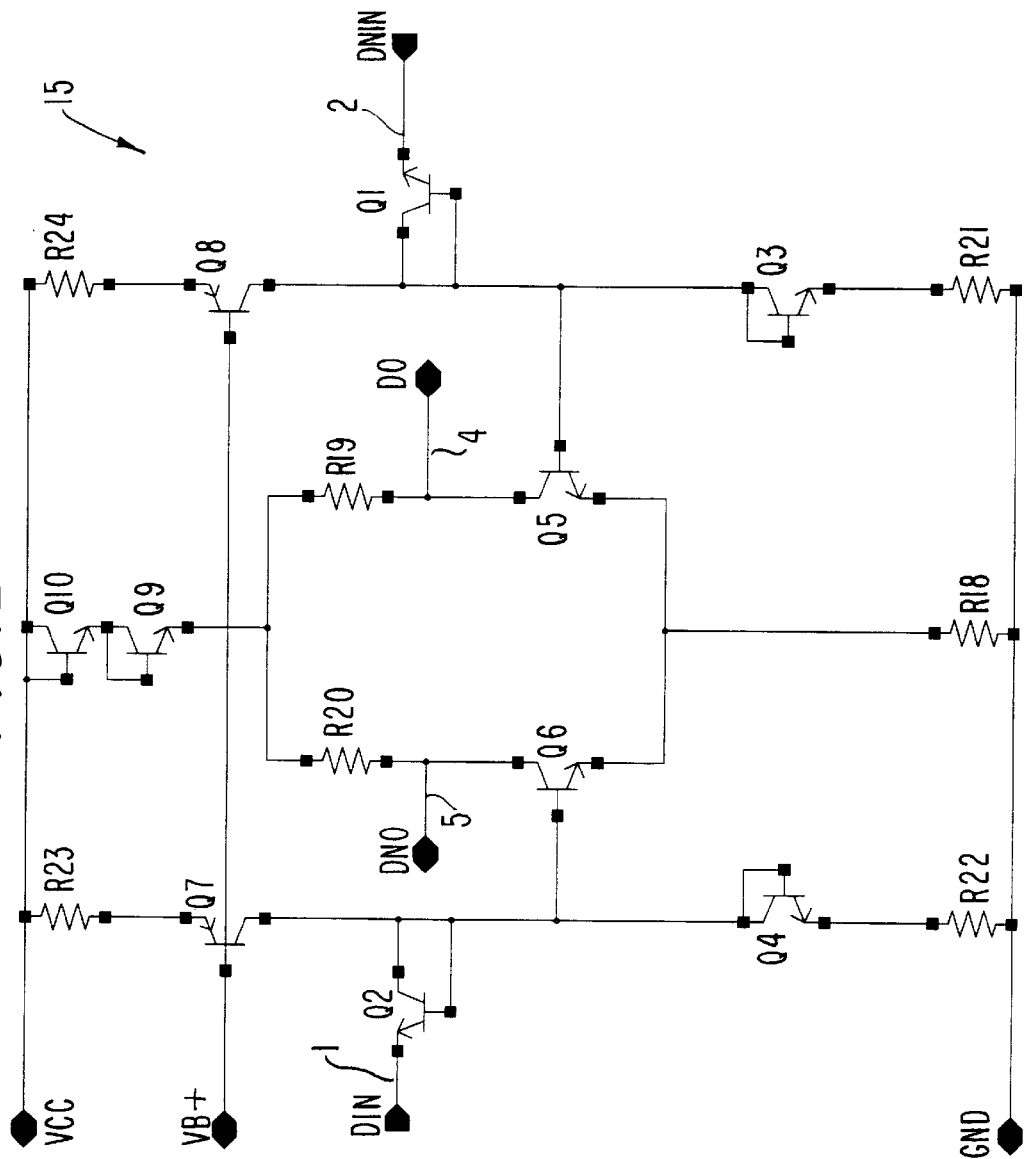
FIG. 2 is a schematic diagram of the input circuit block for the transmitter section of the transceiver.

Referring initially to FIG. 1, a transceiver of the present invention includes both transmitter and receiver portions powered by a common system bias portion 29. For stability purposes and to accommodate manufacturing process tolerances, the system bias may preferably be current, rather than voltage, driven. The transceiver is formed as a 5 v monolithic ASIC construction. The transmitter section receives bi-phase TTL data input, TX $\overline{\text{Data IN}}$, TX Data IN, and INHIBIT signals on input signal lines 1, 2 and 3 respectively. The TX DATA IN and TX $\overline{\text{DATA}}$ IN signals on lines 1 and 2 are applied to an input circuit 15, detailed in FIG. 2, which converts TTL (transistor-transistor logic) logic signal levels generated by a system intended to be coupled to the data bus to ECL (emitter-coupled logic) logic signal levels. This circuit functions as a "Exclusive Or" and provides a non-zero differential output voltage, $D_o-D_{no}$, on signal lines 4 and 5 when input signals TX DATA IN and TX $\overline{\text{DATA}}$ IN on lines 1 and 2 are switching due to the presence of input data. When the input signals are in the same phase (ie. both high or both low) the differential output voltage is zero. The differential output voltage, $D_o-D_{no}$ on signal lines 4 and 5 is applied to a differential comparator (See FIG. 4). This circuit block also contains a first pulse truncation comparator circuit, consisting of Q1–Q6, Q15 and an on-board capacitor, which reduces the width of the first half pulse only. Truncation of the first half pulse is performed so that the first half output pulse leaving the transmitter on signal lines 11 and 14, which ordinarily tends to be widened by turn-on delay and filtering, will have the proper width.

Figure 4:
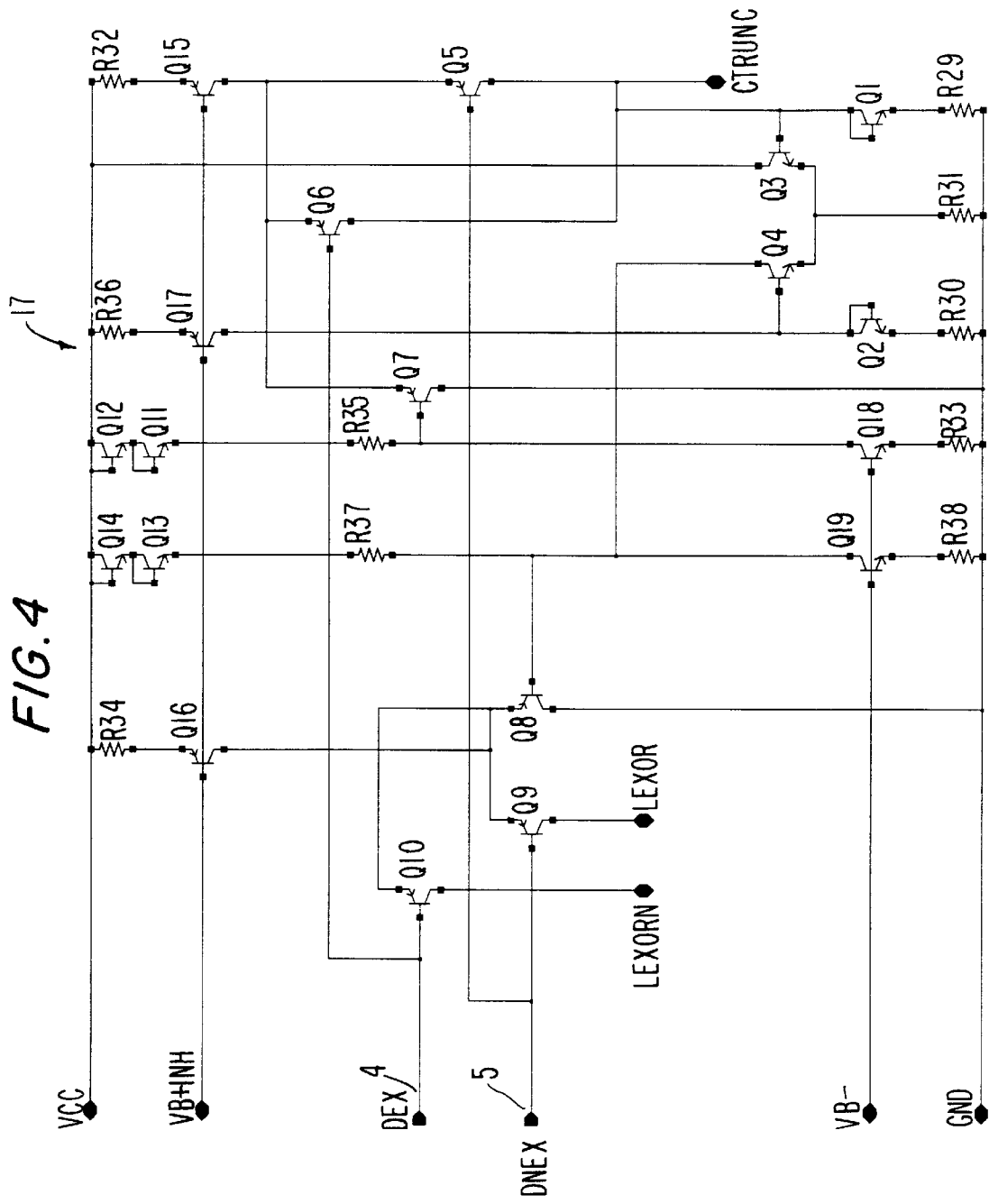
FIG. 4 is a schematic diagram of the sync width control circuit block of the transmitter section of the transceiver.

The differential input signals to circuit block 17 of FIG. 4 on lines 4 and 5 are also connected to the bases of Q10 and Q9, and are compared to a reference voltage at the base of Q8. When either input signal is below the reference voltage, Q10 and Q9 will be correspondingly alternately switched on, diverting the tail current supplied by Q16 to the output signal line 7 or 8. These currents flow into the respective on-board resistors on output lines 7 and 8 seen in FIG. 1 and develop the associated output driver input voltages. The driver input voltages on signal lines 7 and 8 are applied to the output drivers 22 and 23, respectively. It is to be appreciated that the circuit elements forming the output drivers are identical in both paths. Thus, the Figures representing these blocks depict both elements.

Figure 3:
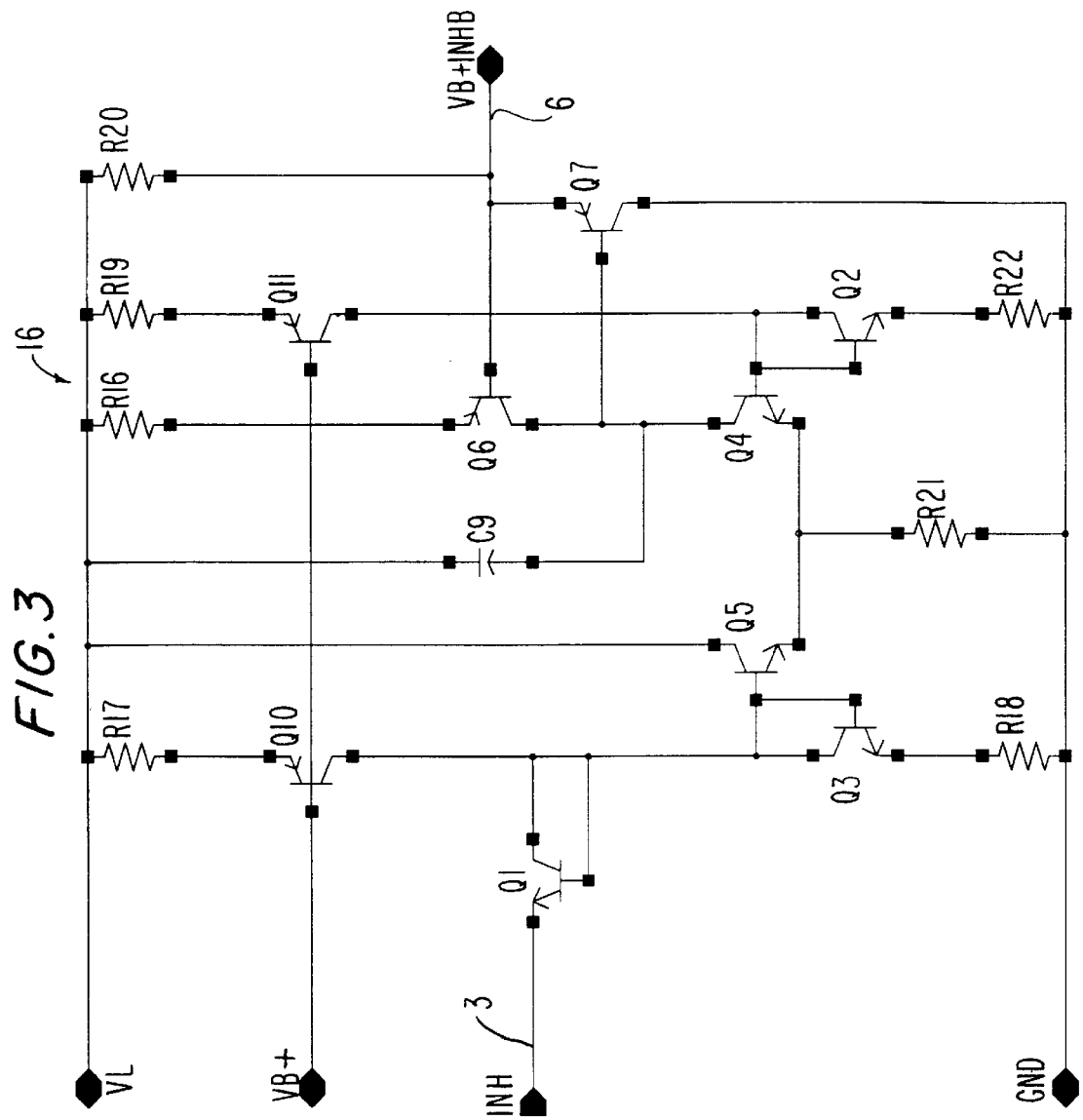
FIG. 3 is a schematic diagram of the inhibit circuit block for the transmitter section of the transceiver.

All the bias currents in block 17 are generated from two bias voltage inputs, labeled vb+Inh and vb−. Vb− is supplied from the master bias circuit 29 of FIG. 1 and connects to the bases of Q18 and Q19. The vb+Inh signal is supplied by the Inhibit circuit block 16, detailed in FIG. 3, via signal line 6, and connects to the bases of Q15–Q17. With reference to FIG. 3, when the input signal INHIBIT on signal line 3 is greater than +2 v the vb+Inh output voltage on signal line 6 disables the Q15–Q17 current sources, which reduces the driver input voltages on lines 7 and 8 to zero. The vb+Inh signal on line 6 is generated from the INHIBIT circuit block 16 of FIG. 3. This circuit in turn compares the TTL input signal INHIBIT on signal line 3 to a reference voltage at the base of Q4. When this signal is below +0.7 v the vb+Inh inhibit output on signal line 6 is enabled. The vb+Inh signal is also sent to both output driver circuit blocks 22 and 23 (FIG. 1) to enable and disable bias current sources as will be described. Bias currents for this block are also developed from the enabling input voltage, Vb+, from the master bias circuit 29.

Figure 5:
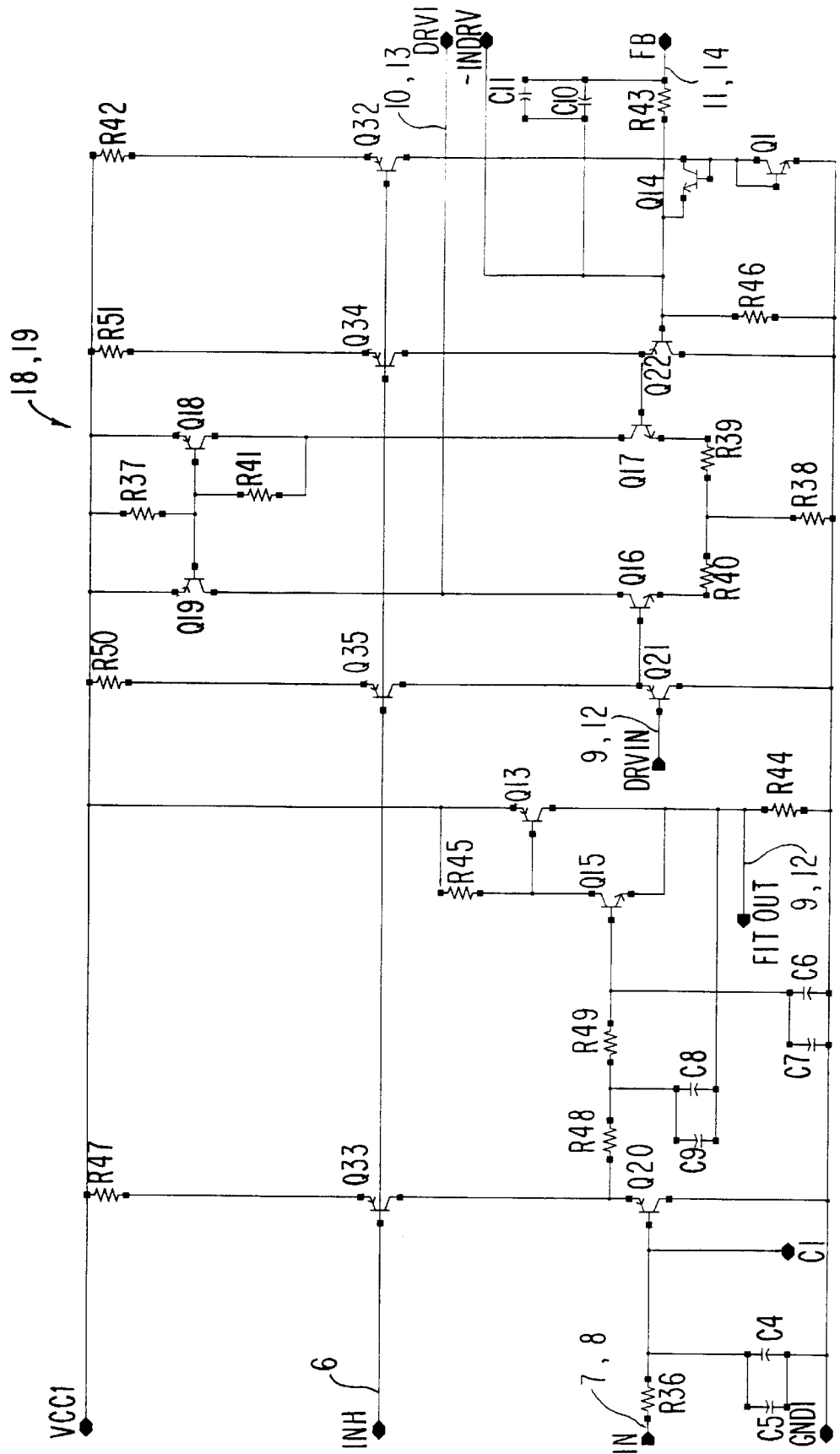
FIG. 5 is a schematic of the filter circuit portion of the output drivers for the transmitter section of the transceiver.

Referring again to FIG. 1, the driver input voltages on signal lines 7 and 8 are applied to the respective filter/predriver circuit blocks 18, 19, shown in FIG. 5. Within these blocks the signals are applied to emitter follower Q20, which buffers the signal sent to a two pole filter formed by Q13, Q15, R44, R45, R48, R49 and capacitors C6–C9. A single pole filter, formed by R43, C10 and C11, in conjunction with the previous two pole filter form the overall transmit filter. This filter is required to shape the transmit signal output to the known MACAIR requirements. The input signals on lines 7 and 8 are uni-polar and start from ground, and thus the two pole filter output/predriver input voltage on signal line 9 also starts from ground due to the follower action of Q20 and Q13/15. The predriver portion of circuit blocks 18/19 of FIG. 5, along with the respective driver 20, 21 detailed in FIG. 6, form a feedback amplifier that is used to drive the step-up coupling transformer 24 and the load resistance 28 representing the transmission line and remote apparatus to which the transceiver output is coupled. The feedback loop is closed with a feedback network consisting of R43, R46, C10 and C11 shown in FIG. 5.

The operation of this combination is as follows. When the vb+Inh signal on line 6 is enabled, current sources Q32–35 become active. The input signals on lines 7, 8 for their respective output drivers 22, 23 will alternately begin to switch from ground to a predetermined positive voltage level in response to the transmit data input signals as previously described. These input signals are buffered, filtered and passed to the predriver portions of blocks 18, 19 on signal lines 9 and 12 and subsequently to drivers 20, 21. The input signals serve two unique functions with regard to the operation of the predriver/driver feedback amplifier. When a driver input signal on lines 9 or 12 is zero volts the differential amplifier in the associated predriver, formed by Q16–19, Q21 and Q22, has no emitter current, since the voltage at the emitter of Q16 is essentially zero. With zero emitter current in Q16 there is no current in any of the transistors in the associated driver circuit block 20/21, as may be seen from inspection of FIGS. 5 and 6.

Figure 6:
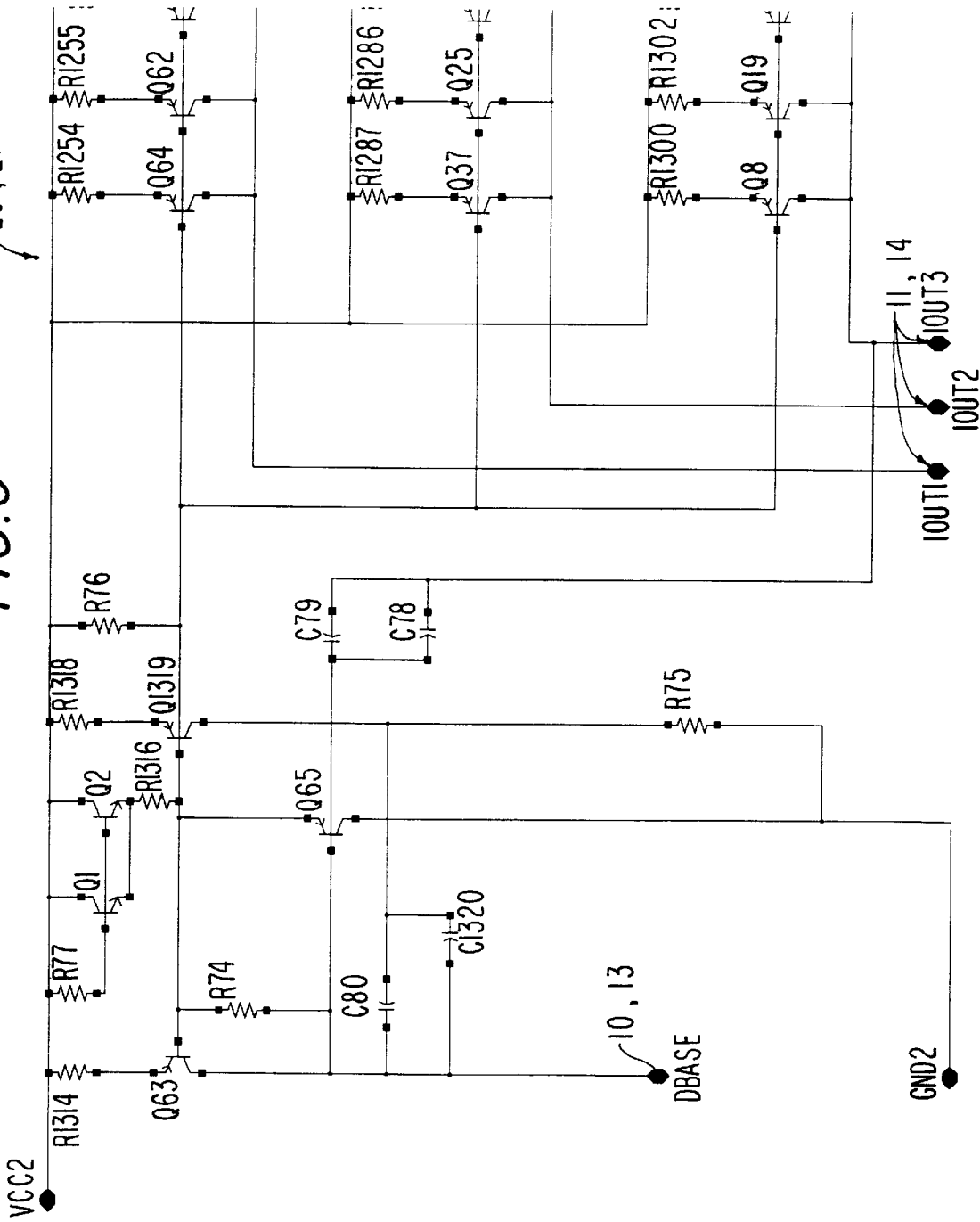
FIG. 6 is a schematic diagram of the driver circuit blocks of the transmitter portion.

As seen in FIG. 6, each of drivers 20, 21 consists of 3 banks of output transistors, which are paralleled and mirrored to the input transistors Q63 and Q65. At this time the output impedance looking into the output signal lines 11/14 is high, since all of the output transistors in the driver are off. As the voltage on the predriver input signal line 9 (FIGS. 1 and 5) starts to swing positive, the voltage on the emitter of Q16 in circuit block 18 (FIG. 5), will follow in response. The non-zero voltage at the emitter of Q16 will start an emitter/collector current flowing in the transistor. This current pulls down the base of Q65 in driver 20, as seen in FIG. 6, turning it and transistor Q63 on. The emitter voltage of Q63 is essentially forced across the emitter resistors of the paralleled output transistors, turning those transistors on and starting an output current to flow in the output signal line 11. An output voltage is thus developed across one-half of the primary winding 25 of the step-up transformer 24 which is connected to the output data signal line 11 (See FIG. 1). The voltage is proportional to the input voltage and is under feedback control as soon as current starts to flow in the driver of 20. The output impedance looking into the output signal line is now low.

The output impedance of the other output signal line 14 is still high, however, since the predriver input signal on the associated circuit block 19 line 12 is zero volts, which results in zero current in the driver 21.

As the output voltage on signal line 11 rises it is sampled by a feedback network, comprising R43, R46, C10 and C11, formed in circuit block 18 (FIG. 5) and starts to turn on Q22 and Q17 therein. Q17 starts to turn on the current mirror formed by Q18 and Q19. Q19's collector current sums into the node formed by it and the collector of Q16, decreasing the current pulling down the base of Q65 in its driver 20, and subsequently starts reducing the initial output current, limiting the rate of rise of the output voltage on line 11. This action continues until an equilibrium is reached at the peak output signal swing, where the required output current is set by the peak output voltage and the reflected load impedance as seen by the output line looking into one-half of the transformer primary winding 25.

At this equilibrium point the differential amplifier formed by Q16 and Q17 is balanced; that is, the emitter currents of Q16 and Q17 are essentially equal, and the current pulling down the base of Q65 in the driver 20/21 is just sufficient to maintain the required output current. With the differential amplifier in balance the voltage at the base of Q22 in circuit block 18 is essentially equal to its driver input voltage on line 9. The voltage on the base of Q22 is then scaled by the feedback network of R43/R48 to set the peak output voltage swing on output signal line 11. Thus, the output voltage on line 11 tends to follow the input voltage on line 9 multiplied by a scale factor. When the predriver/driver input voltage on line 9/12 returns to zero volts all current, except for current sources Q32–Q35 in the predriver and driver circuit blocks, diminish to zero. The voltage clamp formed by current source Q32 and clamp transistors Q1, and Q14 prevent the turn-on of Q22 when the voltage at the fb pin (the right hand side of R43) of circuit block 20 swings negative in response to the circuit block 21 driver turning on as described below. The current sources Q32–Q35 are shut off in response to an inhibit command on transmitter input signal line 3 as seen in FIG. 3 which is passed to line 6. This is done to minimize standby (inhibited) power drain.

When the predriver/driver input voltage on second signal line 12 starts to swing positive, the voltage on the emitter of the corresponding Q16 of circuit block 19 (FIG. 5) will follow in response. The non-zero voltage at the emitter of Q16 will start an emitter/collector current flowing in the transistor. This current pulls down the base of Q65 in driver 21, turning its Q65 and Q63 on. The emitter voltage of Q63 is essentially forced across the emitter resistors of the paralleled output transistors, turning them on, and starting an output current to flow in the output signal line 14. An output voltage is developed across the lower one-half 26 of the primary winding of the step-up transformer 24 connected to signal line 14. This voltage is proportional to the input voltage and is under feedback control as soon as current starts to flow in the driver 21. At this point the output impedance looking into the output signal line 14 is low. The output impedance of signal line 11 is now high, since the predriver input signal on circuit block 18 line 9, is zero volts, which results in zero current in driver 20. The whole process as set forth above is repeated for the output driver of circuit block 23.

It should be noted that while an output driver 20 or 21 is supplying current, it is in a closed loop system with a very low output impedance (essentially a voltage mode source), and when it is not supplying current it is in an off state, with a relatively high output impedance. It is therefore not subject to varying load impedance at the transformer secondary. In addition, if the respective input voltages on input signal lines 7 and 8 are kept equal and constant over temperature variations, there will be little or no offset at the load due to the accumulation of stored charge in the transformer which would be returned to the load when the input signal is terminated. This is an important system parameter. The input voltages on lines 9 and 12 provide the predriver/driver amplifier with both the voltage for amplification, as well as the current necessary to provide the power gain. In the absence of an input voltage there is no quiescent current in the predriver/driver amplifiers.

DETAILED DESCRIPTION OF THE RECEIVER

Referring again to FIG. 1, the receiver section of the 5 v monolithic ASIC receives its input data voltages from input signal lines 11 and 14. The bipolar signals developed on signal lines 11 and 14 will be equal and out of phase. This is the case whether the receiver is monitoring its own transmitter or receiving signals developed across the load resistor 28 from other transceivers which are connected to the load bus. The receiver processes Manchester encoded input signals on lines 11 and 14 and outputs two TTL signals, of opposite phase, on signal lines 44 and 45.

Figure 7:
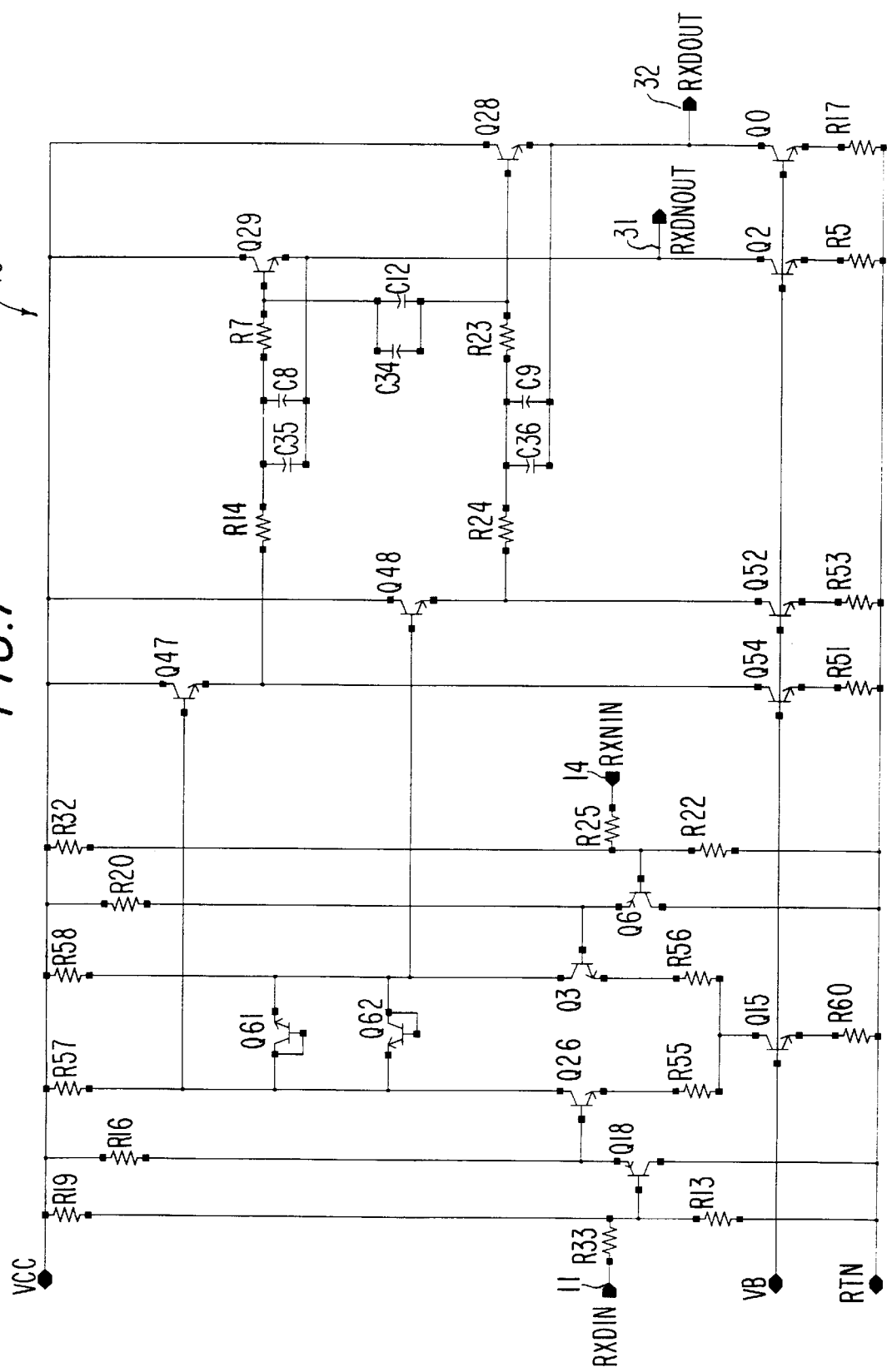
FIG. 7 is a schematic diagram of the input circuit for the receiver portion of the transceiver.

FIG. 7 depicts receiver input/limiter/filter circuit block 49 where the input signals on lines 11 and 14 are applied. The circuit block comprises three circuit functions: (1) a differential amplifier formed by transistors Q18, Q26, Q3, Q6, Q47, Q48 and current source transistors Q15, Q54 and Q52; (2) differential emitter follower filters formed by transistors Q29 and Q28 along with their associated RC components R14, R24, R7, R23, C34–C36, C8, C9, C12 and current source Q2 and Q0; and (3) a diode differential limiter formed by transistors Q61 and Q62. All of the current source transistors in this block receive their enabling voltage, Vb−, from the master bias circuit 29. The input resistor strings R13, R19, R33 and R22, R32, R25, tied to the input signal lines 11 and 14, respectively, bias the differential amplifier in the linear range and attenuate the input signals for proper operation over the expected signal range. The differential output voltage developed at the emitters of Q47 and Q48 is applied to the input resistors R14 and R24 of the differential filter. This two pole filter, together with an additional pole located in the differential amplifier of circuit block 50 (FIG. 8), form an overall receiver filter. Such receiver filtering is used to improve the signal-to-noise ratio of the receiver.

Figure 8:
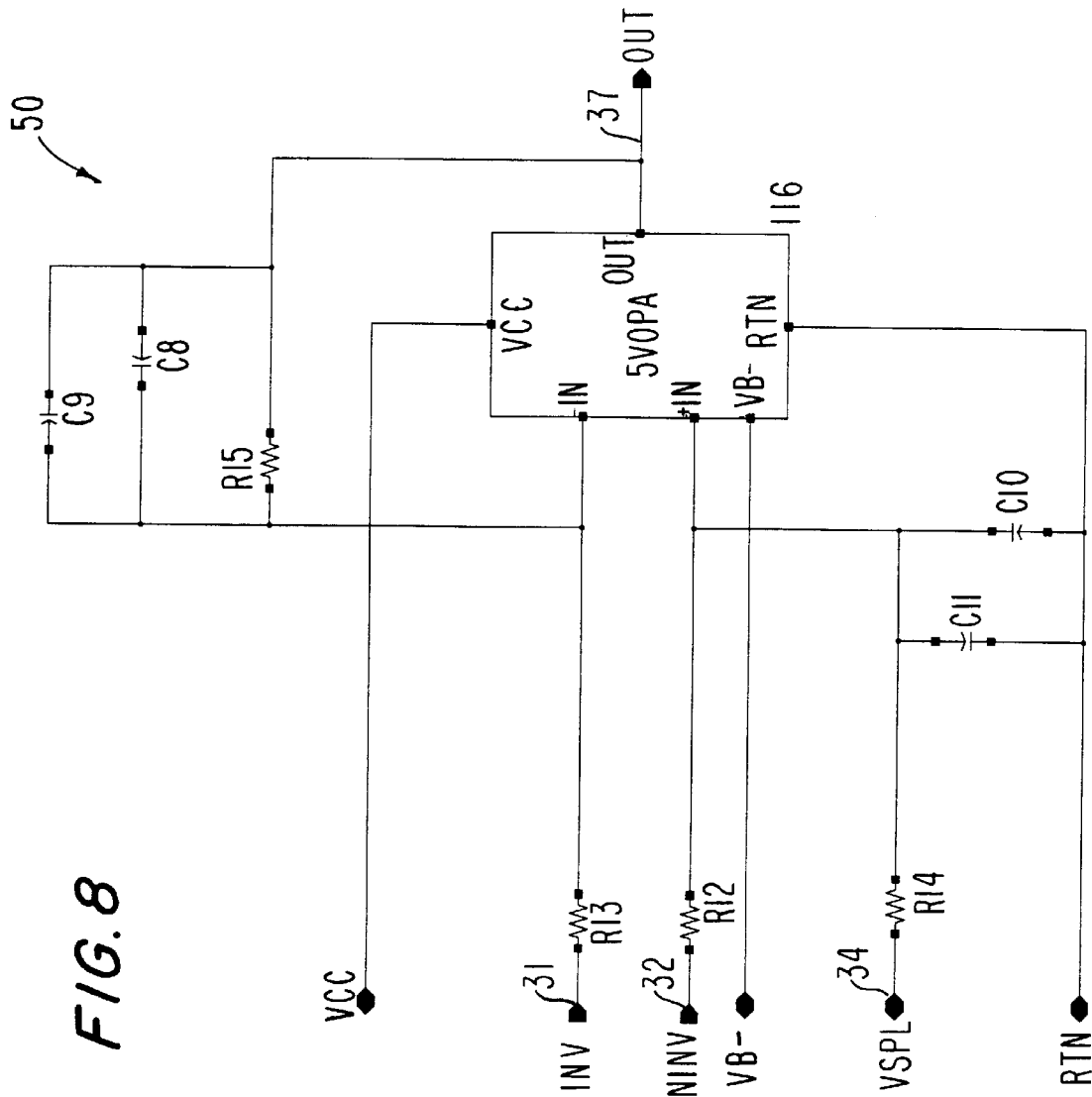
FIG. 8 is a schematic diagram of the differential amplifier of the receiver portion.

The filtered differential output voltage of the input/limiter/filter circuit block 49 of FIG. 7 is connected to the amplifier/filter block 50 of FIG. 8 via signal lines 31 and 32. Amplifier/filter 50 subtracts, filters and readies the input signals for comparison to preset dc voltages developed in the threshold circuit block 52 of FIG. 9. All bias currents in the amplifier of circuit block 50 are developed by the enabling voltage Vb− from the master bias circuit block 29. In addition, a biasing voltage is sent from the threshold circuit of block 52 to bias the amplifier of block 50 at the midpoint of the dc threshold voltages.

Figure 9:
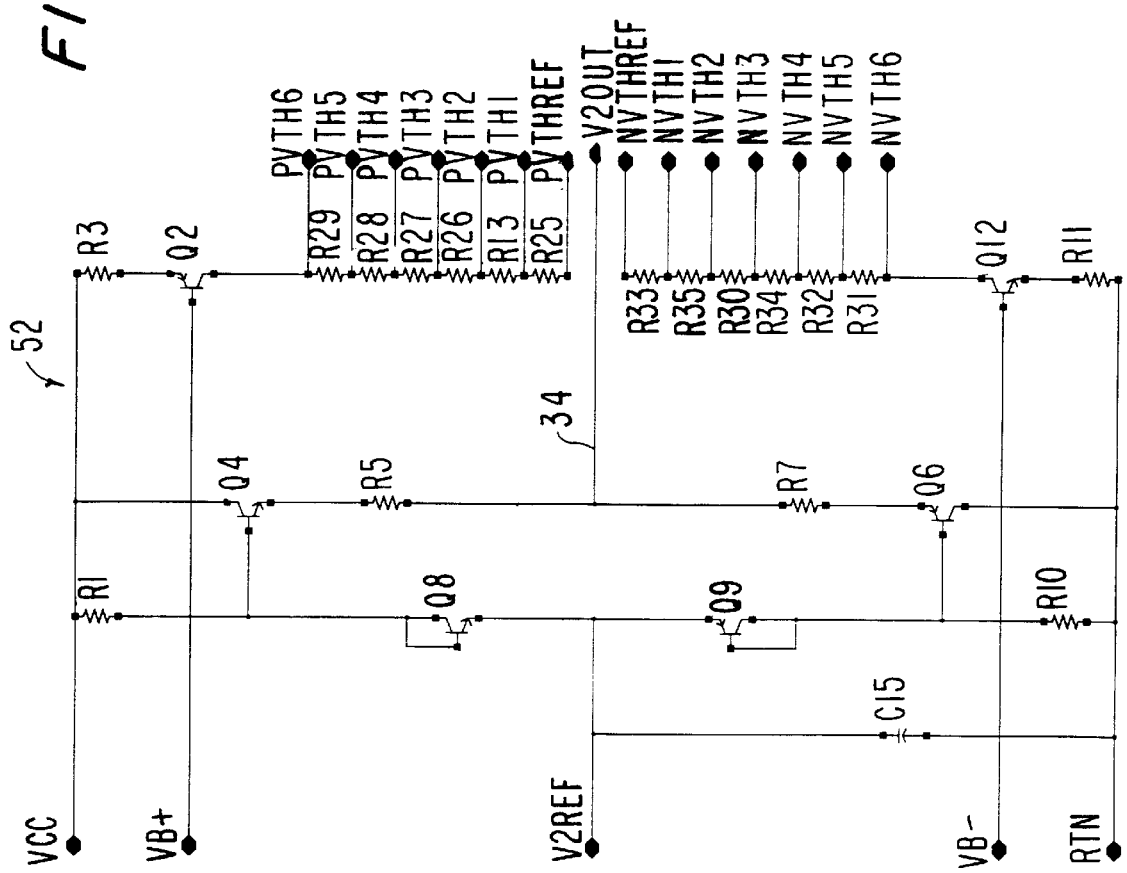
FIG. 9 is a schematic diagram of the threshold circuit of the receiver portion.
Figure 11:
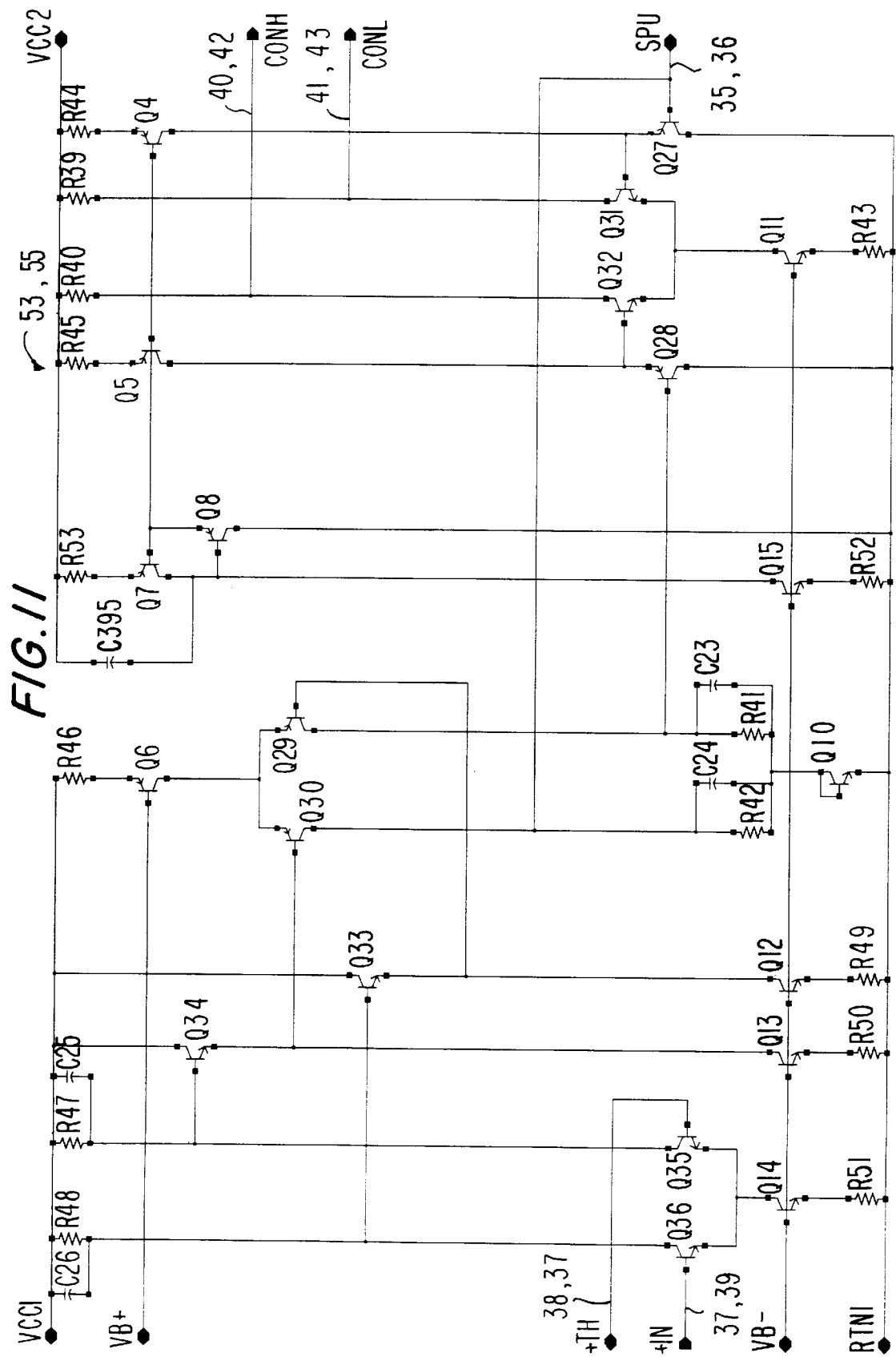
FIG. 11 is a schematic diagram of the comparator circuit portions of the receiver output blocks.

Referring to FIG. 9, the threshold circuit block 52 develops the dc voltages that will be used by the comparator circuit blocks 53 and 55 of FIG. 11. A +Vth and a −Vth dc voltage are developed relative to the midpoint bias voltage sent to the differential amplifier block 50. This midpoint bias voltage is formed on input signal line 33 of the threshold circuit block 52, and is buffered by the transistors Q4, Q6, Q8 and Q9. The output of the buffer is used as the bias voltage on signal line 34. The +Vth/−Vth voltages are developed by current sources Q2, Q12, respectively, and associated resistor strings R13, R25–R29, and R30–R35 and are relative to the midpoint voltage on signal line 34, since the pvthref, nvthref and the v2out signals are connected on board the ASIC. A few of the resistor taps may be brought out as ASIC I/O to provide a means of selecting a limited range of threshold settings. In FIG. 8 the dc voltage level on signal line 37 at the output of the differential amplifier is essentially equal to the bias voltage supplied to it on signal line 34. Therefore the +Vth and −Vth dc voltages are also relative to the midpoint dc voltage signal on line 37. The input block 46 of FIG. 1 also contains a receiver strobe circuit block 51 which will be discussed in conjunction with receiver output blocks 47 and 48.

In FIG. 1 the comparator circuit blocks 53 and 55 of the respective output blocks 47 and 48 are each configured as window comparators as presented in FIG. 11. The comparators operate as follows: In the absence of any input signal on the data input line 11 or 14 of the respective input block 46, the comparator is in its rest state. For the comparator of circuit block 53 the initial condition is that the dc voltage level on signal line 38 is greater than the dc voltage level on signal line 37. For the comparator of circuit block 55 the initial condition is that the dc voltage level on signal line 37 is greater than the dc voltage level on signal line 39. Under these conditions for the respective comparator circuit, Q36 is off and Q35 is on, Q29 is off and Q30 is on, and Q32 is off and Q31 is on, which sets the output signal lines 40, 42 and 41, 43 high and low, respectively. Comparator circuit block 53's output signal lines 40 and 41 are sent to ECL/TTL output converter circuit block 54 and comparator circuit block 55's output signal lines 42 and 43 are sent to the ECL/TTL output converter circuit block 56.

When the differential input signal on receiver input signal lines 11 and 14 is positive the output signal line 37 from the differential amplifier block 50 of FIG. 8 is also positive. With the signal on line 37 more positive than the +Vth voltage on signal line 38, comparator block 53 switches state and all of its signal path transistors, previously described in their rest state condition, change state, forcing the output signals on lines 40 and 41 to change state. The comparator of circuit block 55 does not switch state, since the dynamic level on signal line 37 is still greater than the dc signal level on line 39. When the differential input signal on signal lines 11 and 14 is negative the output signal line 37 from differential amplifier 50 is also negative. When the signal line 37 is more negative than the −Vth voltage on signal line 39, comparator 55 switches state and all its signal path transistors change state, forcing the output signals on lines 42 and 43 to change state. The comparator of circuit block 53 does not switch state, since the dc signal level on line 38 is still greater than the dynamic level on signal line 37. The net result is a toggle of the output on line 44, 45 in accordance with receiver input. All current sources in the comparator circuit blocks get their enabling voltages Vb+ and Vb− from the master bias circuit block 29.

Figure 10:
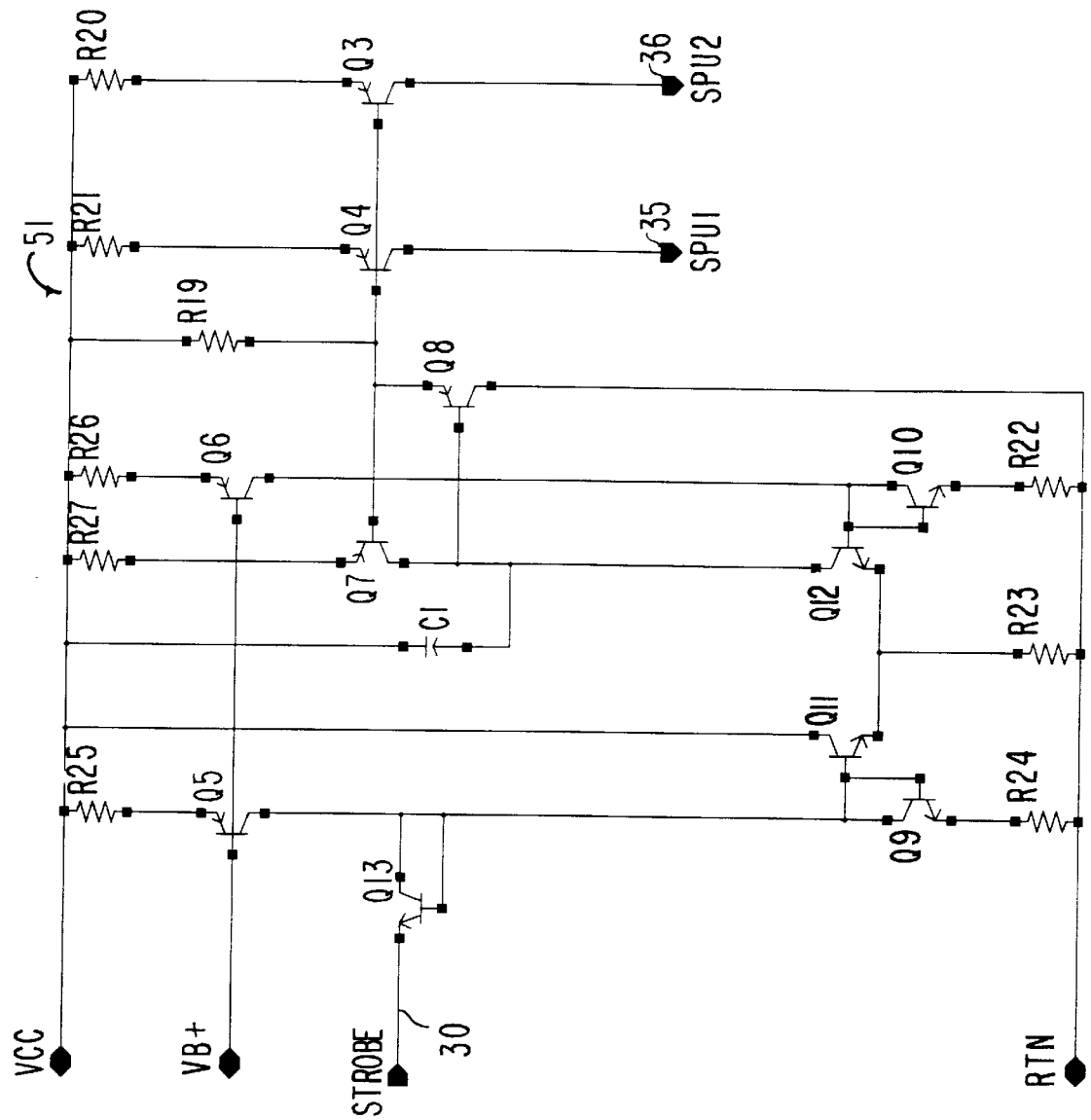
FIG. 10 is a schematic diagram of the strobe circuit portion of the receiver.

An override input to the comparators comes from the strobe circuit block 51, located in the receiver input block 46, operating as follows: Referring to FIG. 10, the strobe circuit compares the TTL input signal Strobe on signal line 30 to a reference voltage at the base of Q12. When the Strobe input signal is greater than +2 v, Q11 is on while Q12, as well as the current mirror formed by Q3, Q4, Q7, and Q8, are off. Under this input condition the output currents on signal lines 35 and 36 are zero. When the Strobe input signal is greater than +2 v, Q11 is on and while Q12 and the current mirror formed by Q3, Q4, Q7, and Q8 are off. Under this input condition the output currents on signal lines 35 and 36 are zero. When the Strobe input signal is below +0.7 v Q11 is off and Q12 is on, turning on the current mirror. Under this input condition the currents on signal lines 35 and 36 are enabled and sent to the comparator circuit blocks 53 and 55, where they are summed into the node formed by the collector of Q30 and R42 as seen in FIG. 11. The additional current from the strobe circuit 51 causes the final stage transistors, Q32 and Q31, into their rest state, no matter what state they were in prior to the application of the Strobe input signal on line 30. This sets the output signal lines 40, 42 and 41, 43 high and low, respectively, for as long as the Strobe input signal on line 30 remains below +0.7 v.

Figure 12:
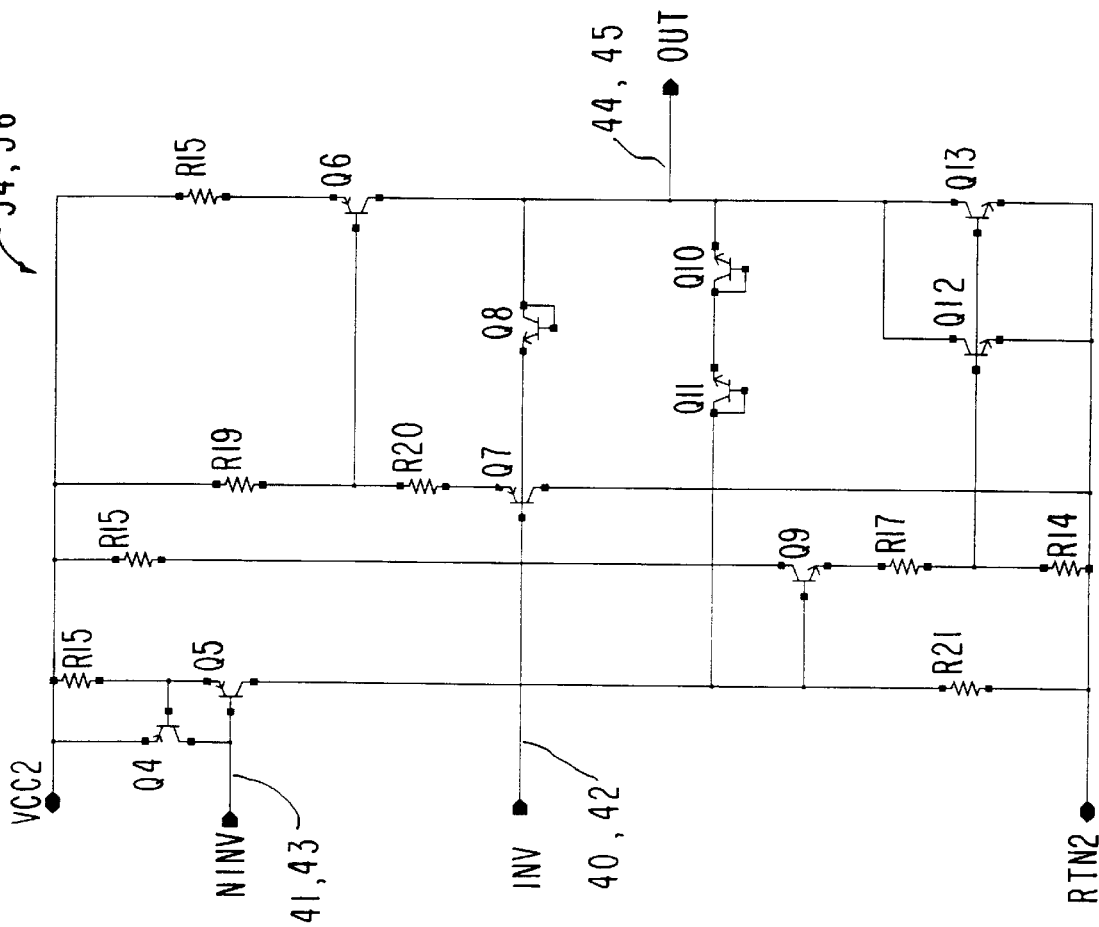
FIG. 12 is a schematic diagram of the TTL convertor circuit portions of the receiver output blocks.

Referring to FIG. 12, the last two circuits in the receiver are the ECL to TTL converter blocks 54 and 56. These blocks get their respective input signals from the comparator blocks 53 and 55 as shown in FIG. 1. When the comparators are in their rest state the inputs on signal lines 40, 42 are high and the inputs on signal lines 41, 43 are low. This sets the respective TTL circuit to its rest state, since a low on input line 41 causes Q4/Q5 to come on, which then forces Q9–Q13 to come on. A high on signal line 40 or 42 causes the respective Q6–Q8 to go off. Under this input condition an output low level is produced on the respective signal line 44, 45. When either of the comparators in circuit blocks 53 and 55 change state, the corresponding TTL circuit block 54, 56 also changes state, and the state of the previously described transistors reverse. That is, Q4/Q5, Q9–Q13 go off and Q6–Q8 come on, producing an output high level on signal lines 44 or 45.

Those skilled in the art will recognize that a data transceiver and transmitter in accordance with the present invention may be modified from the embodiment set forth herein without departing from the scope of the invention as encompassed by the annexed claims.

I claim:

1. An amplifier comprising an input wave-shaping circuit having an output; a predriver coupled to the output; a driver coupled to said predriver, said driver having an output transistor group having feedback means coupled to the predriver and an output; means for controlling quiescent current for the predriver based upon the predriver's input signal state, whereby the quiescent current is zero when the predriver input signal state is zero and non-zero when the input signal state is non-zero such that the current in the output transistor group is zero and the feedback means is operatively disengaged to place the output impedance of the output transistor group high when the input signal is zero.

2. A data transmitter comprising an input wave-shaping circuit having a pair of outputs; a predriver coupled to each of said outputs; a driver coupled to each of said predrivers, each of said drivers having an output transistor group having feedback means coupled to the corresponding predriver and an output coupled to a respective portion of a center-tapped output transformer; means for controlling quiescent currents for the predrivers based upon each predriver's input signal state, whereby the quiescent current is zero when the predriver input signal state is zero and non-zero when the input signal state is non-zero such that current in the corresponding output transistor group is zero and the corresponding feedback means is operatively disengaged to place the output impedance of the output transistor group high when the input signal state is zero.

3. The transmitter of claim 2, wherein each driver output voltage is proportional to a non-zero input voltage to the corresponding predriver and is in a non-zero low impedance state when such a non-zero input voltage is present.

4. The transmitter of claim 3 wherein said feedback loop includes a differential amplifier in said predriver.

5. A monolithic data transceiver, comprising a data transmitter and a data receiver coupled to a common bias source, said transmitter comprising an input wave-shaping circuit having a pair of outputs; a predriver coupled to each of said outputs; a driver coupled to each of said predrivers, each of said drivers having an output transistor group having feedback means coupled to the corresponding predriver and an output coupled to a respective portion of a center-tapped output transformer; means for controlling quiescent currents for the predrivers based upon each predriver input signal state, whereby the quiescent current is zero when the predriver input signal state is zero and non-zero when the input signal state is non-zero such that current in the corresponding output transistor group is zero and the feedback means is operatively disengaged to place the output impedance of the corresponding output transistor group high when the input signal state is zero.

6. The transmitter of claim 5 wherein each driver output voltage is proportional to a non-zero input voltage to the corresponding predriver and is in a non-zero low impedance state when such a non-zero input voltage is present.

* * * * *